(12) United States Patent
Do et al.

(10) Patent No.: US 8,791,556 B2
(45) Date of Patent: Jul. 29, 2014

(54) INTEGRATED CIRCUIT PACKAGING SYSTEM WITH ROUTABLE CIRCUITRY AND METHOD OF MANUFACTURE THEREOF

(71) Applicant: STATS ChipPAC Ltd., Singapore (SG)

(72) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/791,375

(22) Filed: Mar. 8, 2013

(65) Prior Publication Data

US 2013/0256861 A1    Oct. 3, 2013

Related U.S. Application Data

(60) Provisional application No. 61/617,569, filed on Mar. 29, 2012.

(51) Int. Cl.
*H01L 23/28* (2006.01)
*H01L 21/56* (2006.01)

(52) U.S. Cl.
USPC ............ 257/673; 257/668; 257/E23.031; 257/E23.033; 257/E23.034; 257/E23.049; 257/E23.053; 257/E23.056; 257/E23.06; 438/111; 438/123

(58) Field of Classification Search
USPC ............... 257/668, 676, E23.031, E23.033, 257/E23.034, E23.053, E23.056, E23.06; 438/111, 123
See application file for complete search history.

(56) References Cited

U.S. PATENT DOCUMENTS

| | | | |
|---|---|---|---|
| 5,175,060 A * | 12/1992 | Enomoto et al. | 428/620 |
| 6,316,952 B1 | 11/2001 | Ahmad et al. | |
| 6,756,253 B1 | 6/2004 | Farnsworth et al. | |
| 6,909,194 B2 | 6/2005 | Farnworth et al. | |
| 8,551,820 B1 * | 10/2013 | Foster et al. | 438/123 |
| 2011/0210441 A1 * | 9/2011 | Lee et al. | 257/737 |

* cited by examiner

*Primary Examiner* — Peniel M Gumedzoe
(74) *Attorney, Agent, or Firm* — Ishimaru & Associates LLP (57) ABSTRACT

An integrated circuit packaging system, and a method of manufacture therefor, including: electrical terminals; circuitry protective material around the electrical terminals and formed to have recessed pad volumes; routable circuitry on the top surface of the circuitry protective material; and an integrated circuit die electrically connected to the electrical terminals.

18 Claims, 9 Drawing Sheets

INTEGRATED CIRCUIT PACKAGING SYSTEM WITH ROUTABLE CIRCUITRY AND METHOD OF MANUFACTURE THEREOF

CROSS-REFERENCE TO RELATED APPLICATION(S)

This application claims the benefit of U.S. Provisional Patent Application Ser. No. 61/617,569 filed Mar. 29, 2012, and the subject matter thereof is incorporated herein by reference thereto.

TECHNICAL FIELD

The present invention relates generally to an integrated circuit packaging system, and more particularly to a system for providing multi-row lead frame packages with reliable interconnect structures to a printed circuit board.

BACKGROUND ART

In the electronic packaging industry, package coupling to the next level system is always an opportunity for failure. The connection of package contacts to printed circuit board contacts has always been an issue. Package reliability can be measured by the amount of force required to tear a package off a printed circuit board.

In existing routable lead frame packages, the ball pad level protrudes farther than the trace protection material. Offset or misaligned balls, ball bridging, and solder ball fall-off are few of the problems encountered at the solder ball attach process. These issues represent increased costs to manufacturing and a reduction in board level reliability (BLR).

Furthermore, flux application even with pin transfer methodology is difficult to contain because the solder material in the ball pad area as it tends to flow off the ball pad due to mound shape of the ball pad after processing. Ball coplanarity was found to be at upper specification limit as well, which limits the manufacturing yield of the finished package.

With the continued industry pressure to reduce costs and improve product reliability, these issues are currently managed by additional inspections and rework of discrepant material. While the additional inspections and rework can improve the end product reliability, the additional cost can be prohibitive.

Thus, a need still remains for an integrated circuit packaging system with routable lead frame that can address the issues of cost and reliability. In view of the commercial demand for lower costs and improved product reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

Embodiments of the present invention provide an integrated circuit packaging system, and a method of manufacture therefor, that includes: electrical terminals; circuitry protective material around the electrical terminals and formed to have recessed pad volumes; routable circuitry on the top surface of the circuitry protective material; and an integrated circuit die electrically connected to the electrical terminals.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface to which the die is bonded, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure. Each of the steps of processing such as etching, chemical removal, laser machining, grinding, buffing, etc. leaves residual structures in the materials processed characteristic of the step.

This concept is applied with Routable Lead frame Package having multi-row lead frame with circuit routing concept.

Figure 1:
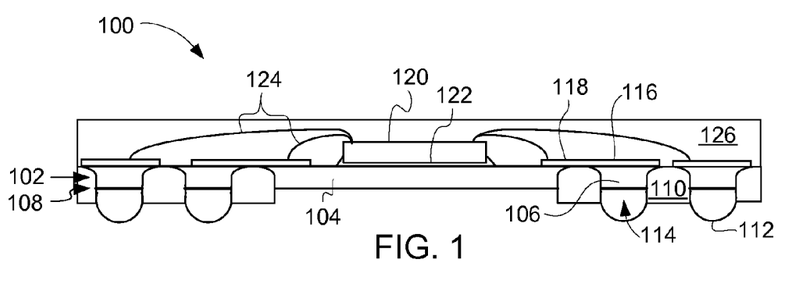
FIG. 1 is a cross-sectional view of an integrated circuit packaging system.

Referring now to FIG. 1, therein is shown a cross-sectional view of an integrated circuit packaging system 100.

The integrated circuit packaging system 100 includes a lead frame 102. The lead frame 102 includes a die attach paddle 104 and electrical terminals 106. The lead frame 102 is of a conductive material, such as copper. The die attach paddle 104 and the electrical terminals 106 can have bottoms of bare conductive material or a solder wettable material 108. The solder wettable material 108 can be of materials such as nickel/gold or nickel/palladium/gold.

A circuitry protective material 110 holds the die attach paddle 104 and electrical terminals 106 in a fixed position relative to each other. The circuitry protective material 110 is a non-conductive material such as a molding compound, curable under-fill, or curable epoxy, which protects parts mounted on the lead frame 102 from undesired environmental conditions.

Solder balls 112, of a fusible material, extend upward into the circuitry protective material 110 into a recessed pad volumes 114 adjacent to the electrical terminals 106. It has been discovered that the recessed pad volumes 114 keeps the solder balls 112 from movement during the solder reflow process. This results in robust board level reliability because the solder balls 112 filling the recessed pad volumes 114 provides more strength and ductility to the solder while being supported by the circuitry protective material 110.

It has been unexpectedly found that the circuitry protective material 110 having the recessed pad volumes 114 filled with solder addresses several major manufacturing yield issues and system level performance issues. By maintaining the position of the solder balls 112 attached to the electrical terminals 106 fewer manufacturing failures are detected and the extra support provided by the circuitry protective material 110 removes shear weakness from being a problem with the solder ball structures.

Thus, it has been discovered that the integrated circuit packaging system of embodiments of the present invention furnish important and heretofore unknown and unavailable solutions, capabilities, and functional aspects for manufacturing ball grid array package systems having multiple rows of the solder balls 112.

On top of the circuitry protective material 110 and in contact with the electrical terminals 106 are top pads 116 of conductive material. The top pads 116 may be part of routable circuitry 118, which may be conductive wires or printed circuit traces.

An integrated circuit die or package, typified by a die 120, with a die attach material 122 is adhesively bonded over the die attach paddle 104. The die attach material 122 is non-conductive and generally bonds to any material. The die 120 is then bonded, generally by ultrasonic bonding, by wire interconnects 124 of conductive material, such as copper or gold, to the top pads 116 and the routable circuitry 118. Finally, an encapsulation 126, such as epoxy or plastic, seals the top pads 116, the routable circuitry 118, the wire interconnects 124, and the die 120 to the circuitry protective material 110.

It has been found that the routable circuitry 118 can route the connections from the solder balls 112 closer to the die 120, which means that the wire interconnects 124 can be shorter. When the wire interconnects 124 are shorter, they are less subject to disconnect when being encapsulated by the encapsulation 126. Further, where the wire interconnects 124 are gold, any reduction in length saves money.

Figure 2:
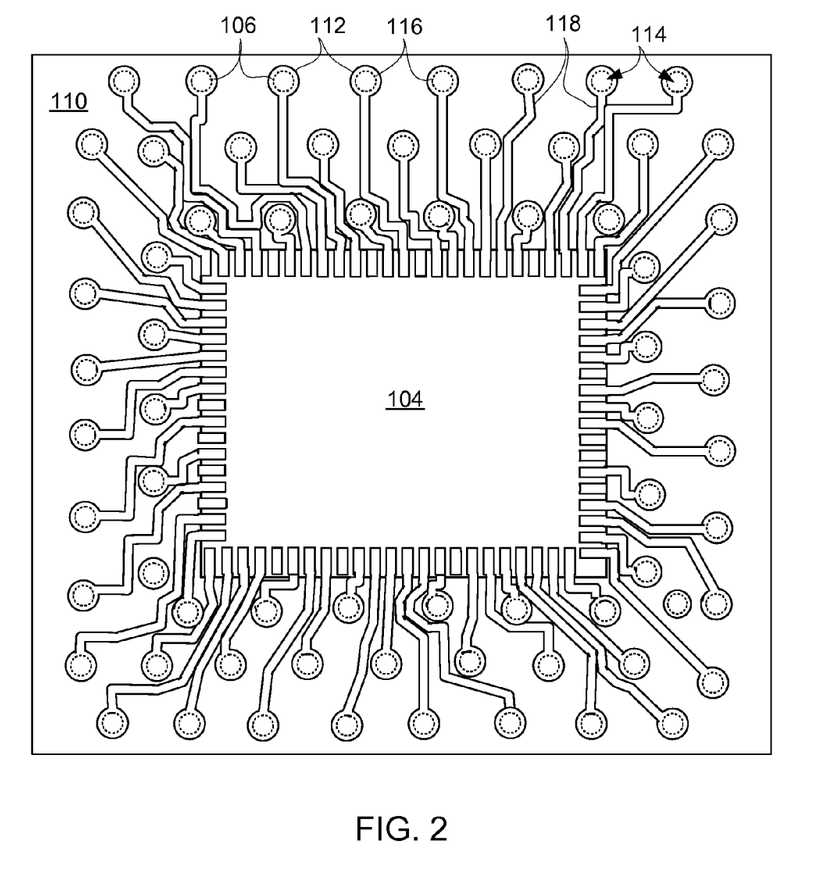
FIG. 2 is a top view of the integrated circuit packaging system.

Referring now to FIG. 2, therein is shown a top view of the integrated circuit packaging system. In FIG. 2, the encapsulation 126, the die 120, and the wire interconnects 124 of FIG. 1 have been removed to better show the die attach paddle 104, the top pads 116 and the routable circuitry 118. The circuitry protective material 110 is visible between the die attach paddle 104, the top pads 116, and the routable circuitry 118. Under the top pads 116 are electrical terminals 106, the recessed pad volumes 114 and the solder balls 112.

Figure 3:
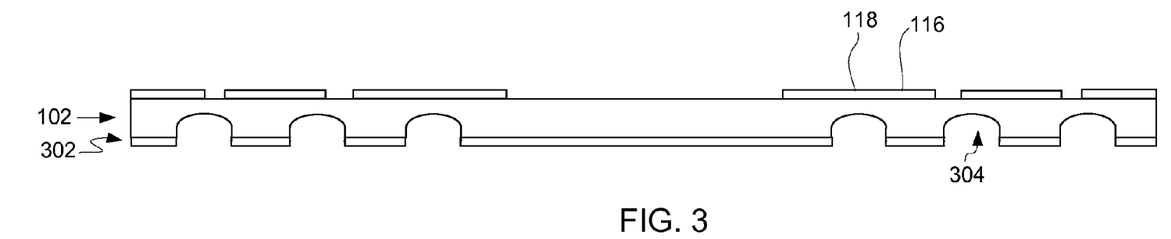
FIG. 3 is a cross-sectional view of a section of a lead frame in a patterning phase of manufacturing.

Referring now to FIG. 3, therein is shown a cross-sectional view of a section of a lead frame 102 in a patterning phase of manufacturing. It should be noted that the lead frame 102 can be in the form of strips or sheets.

The top portion of the lead frame 102 is processed to form the top pads 116 and the routable circuitry 118. A bottom pattern 302 of a surface protective material such as resist or solder wettable conductive material such as nickel/gold, or nickel/palladium/gold is put on the bottom of the lead frame 102. The recessed pad volumes 114 of FIG. 1 are precisely controlled by controlling the thickness of the bottom pattern 302.

The lead frame 102 is processed to provide a pattern 304 in the lead frame 102. A number of different processes including etching and laser processing can pattern the pattern 304 as well as the top pads 116, the routable circuitry 118, and the bottom pattern 302.

It will be understood that the patterning phase of manufacturing can be performed by a supplier of the lead frame 102 to simplify the packaging steps.

Figure 4:
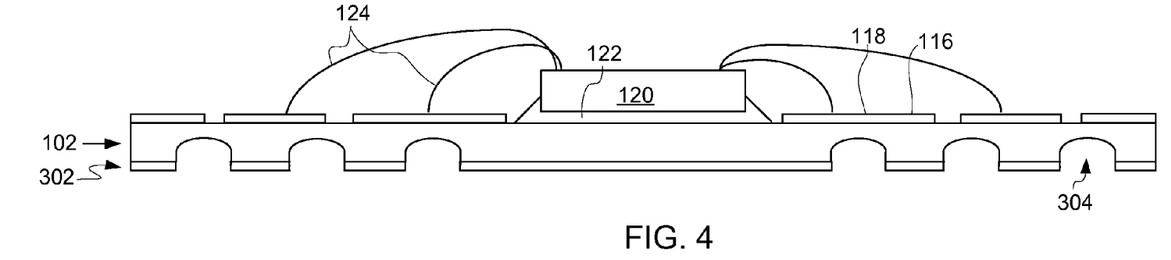
FIG. 4 is a cross-sectional view of a section of the lead frame in a die attach and bonding phase of manufacturing.

Referring now to FIG. 4, therein is shown a cross-sectional view of a section of the lead frame 102 in a die attach and wire bonding phase of manufacturing.

In the die attach and wire bonding phase of manufacturing, the die 120 is adhesively bonded is bonded over the lead frame 102 using the die attach material 122. After die attach, the wire interconnects 124 are bonded between the die 120 and the top pads 116 or the routable circuitry 118.

Figure 5:
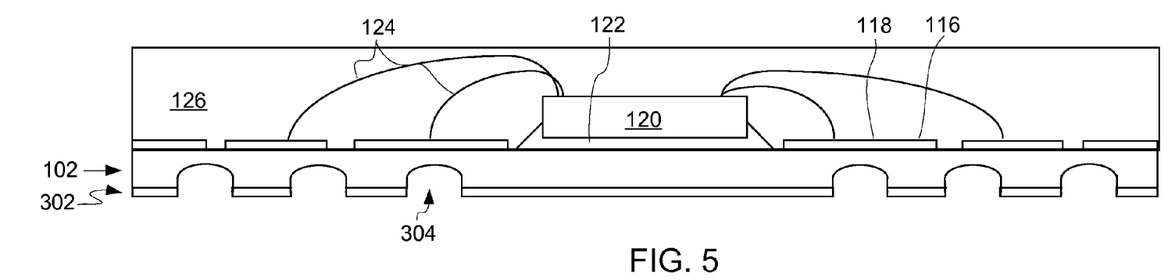
FIG. 5 is a cross-sectional view of the section of the lead frame in a package encapsulation phase of manufacturing.

Referring now to FIG. 5, therein is shown a cross-sectional view of the section of the lead frame 102 in a package encapsulation phase of manufacturing.

In the package encapsulation phase of manufacturing, the encapsulation 126 is molded around the die 120, the wire interconnects 124, the top pads 116, and the routable circuitry 118. It should be noted that the lead frame 102 can be in the form of strips or sheets on which the encapsulation 126 is formed over the entirety of the strip or sheet.

Figure 6:
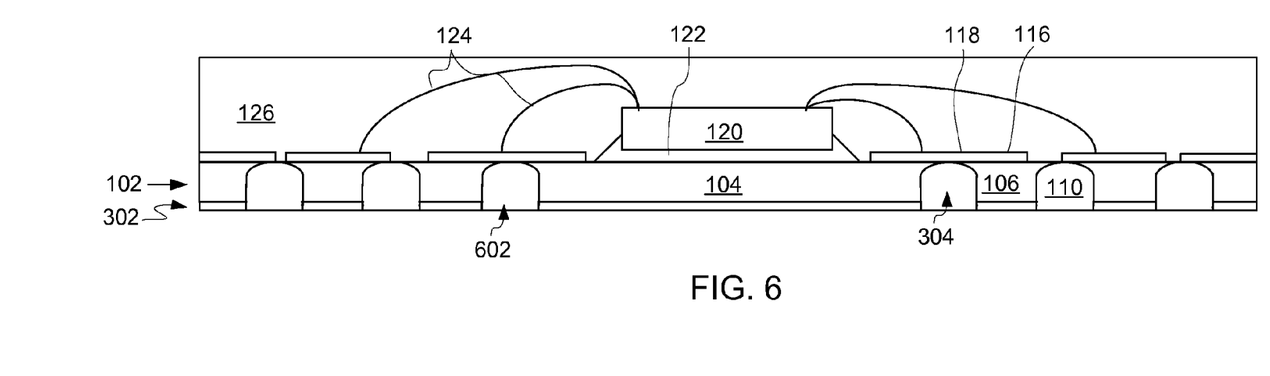
FIG. 6 is a cross-sectional view of the section of the lead frame in a lead frame processing and circuitry protective material fill phase of manufacturing.

Referring now to FIG. 6, therein is shown a cross-sectional view of the section of the lead frame 102 in a lead frame processing and circuitry protective material fill phase of manufacturing.

The lead frame 102 is further processed by a process such as etching and laser processing to deepen further the pattern 304 to form a full-depth pattern 602. The further processing of the full-depth pattern 602 forms the die attach paddle 104 and the electrical terminals 106 from the lead frame 102. The circuitry protective material 110 is then used to fill the full-depth pattern 602 to be coplanar with the bottom pattern 302 and to hold the die attach paddle 104 and the electrical terminals 106 in place.

Figure 7:
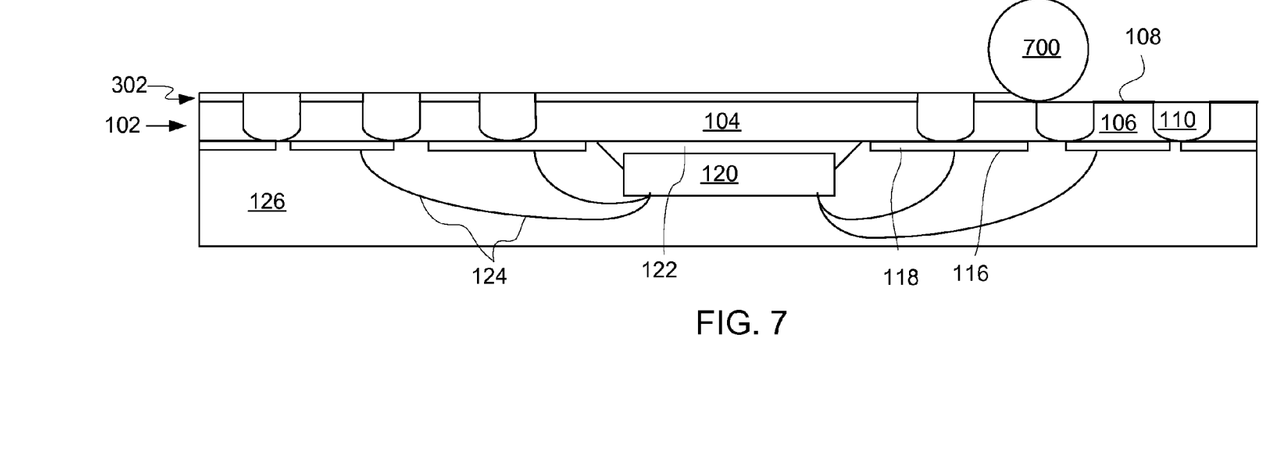
FIG. 7 is a cross-sectional view of the section of the lead frame in a planarization phase of manufacturing.

Referring now to FIG. 7, therein is shown a cross-sectional view of the section of the lead frame 102 in a planarization phase of manufacturing.

The lead frame 102 is planarized to remove the bottom pattern 302 by any planarization technique such as laser machining, buffing, grinding, or other similar surface removal process. Shown in FIG. 7 is a grinding wheel 700 as an example of planarization of the bottom pattern 302.

Optionally, the solder wettable material 108 may be deposited on the bare bottom surfaces of the electrical terminals 106 after planarization.

Figure 8:
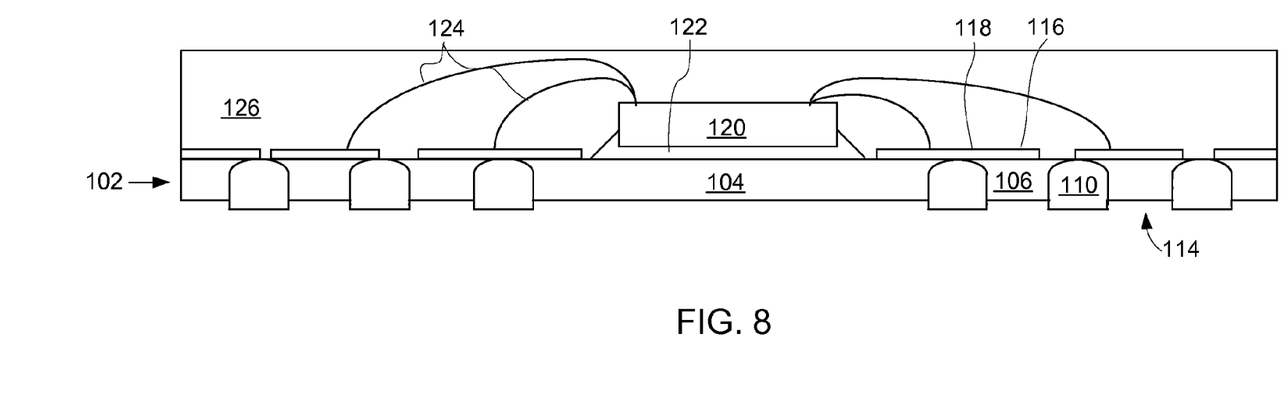
FIG. 8 is a cross-sectional view of the section of the lead frame in a lead frame processing phase of manufacturing.

Referring now to FIG. 8, therein is shown a cross-sectional view of the section of the lead frame 102 in a lead frame processing phase of manufacturing.

In the lead frame processing phase, further material is removed from the lead frame by a process such as etching that leaves the circuitry protective material 110 intact and causes the material of the lead frame 102 to thin with the circuitry protective material 110 protruding from the lead frame 102. This forms the recessed pad volumes 114 below the electrical terminals 106.

Figure 9:
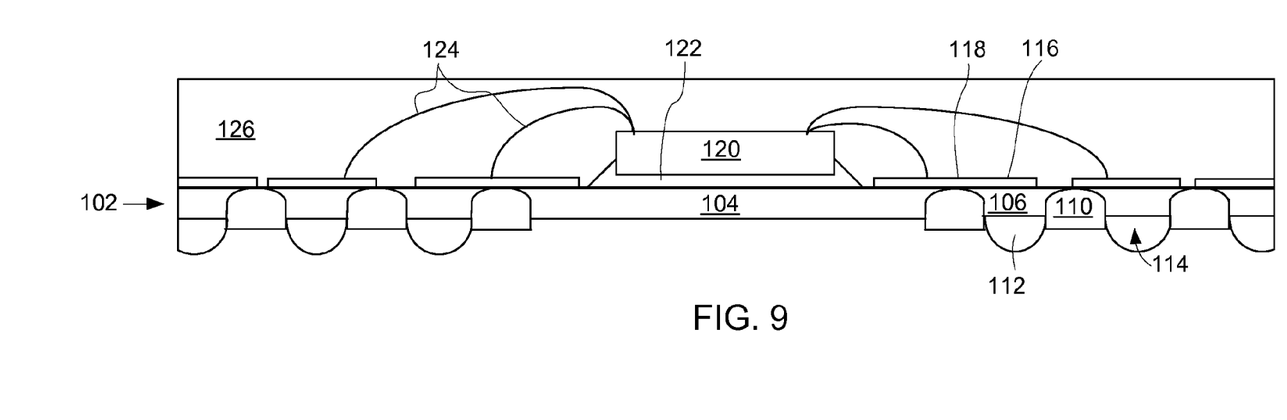
FIG. 9 is a cross-sectional view of the section of the lead frame in a solder ball attach phase of manufacturing.

Referring now to FIG. 9, therein is shown a cross-sectional view of the section of the lead frame 102 in a solder ball attach phase of manufacturing.

In the solder ball attach phase, the solder ball 112 is placed on the electrical terminals 106 in the recessed pad volumes 114 so that a portion of the solder balls 112 extends below the bottom surface of the circuitry protective material 110 and a portion is in the circuitry protective material 110. With the recessed pad volumes 114, it has been found that the solder ball coplanarity is well within the specification limits. Coplanarity is well within the specification limits of 80 um max.

Figure 10:
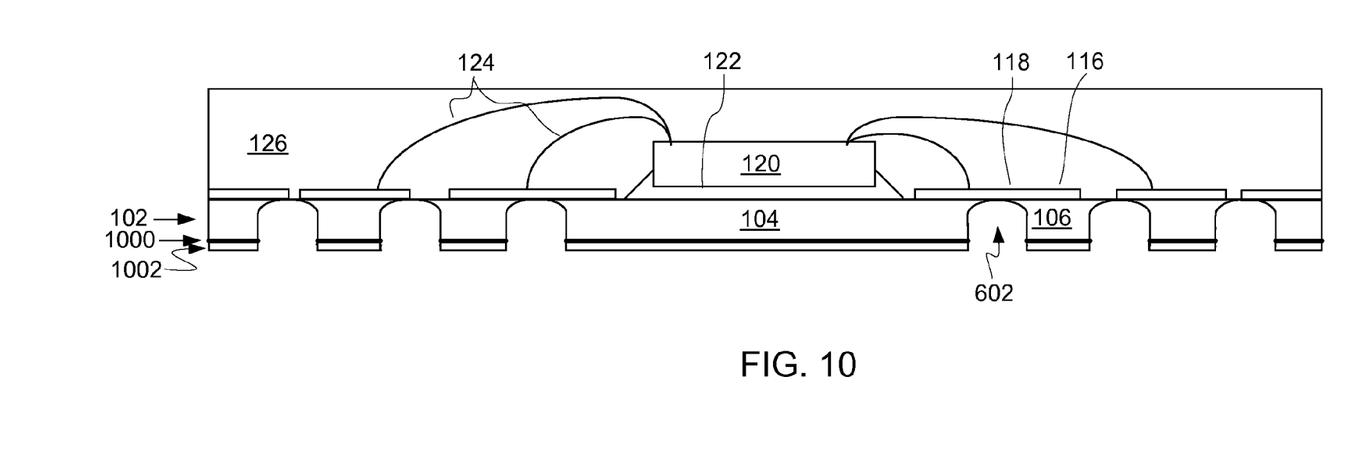
FIG. 10 is a cross-sectional view of the section of the lead frame in a second embodiment of the integrated circuit packaging system.

Referring now to FIG. 10, therein is shown a cross-sectional view of the section of the lead frame 102 in a second embodiment of the integrated circuit packaging system. The first phases of manufacturing are the same as in FIGS. 3 through 6, above, with the exception that a bottom pattern 1000 is a solder wettable material such as nickel/gold or nickel/palladium/gold. After the package encapsulation phase of manufacturing as in FIG. 5, the bottom pattern 1000 is used as a mask to further process the lead frame 102 to form the full-depth pattern 602.

On top of the bottom pattern 1000, a screen layer 1002 is deposited to cover the bottom pattern 1000 over the die attach paddle 104 and the electrical terminals 106. The screen layer 1002 can be a photoresist or a screen printable layer.

Then, the second embodiment fills the full-depth pattern 602 with the circuitry protective material 110 of FIG. 1 to be coplanar with the exposed surface of the screen layer 1002.

Figure 11:
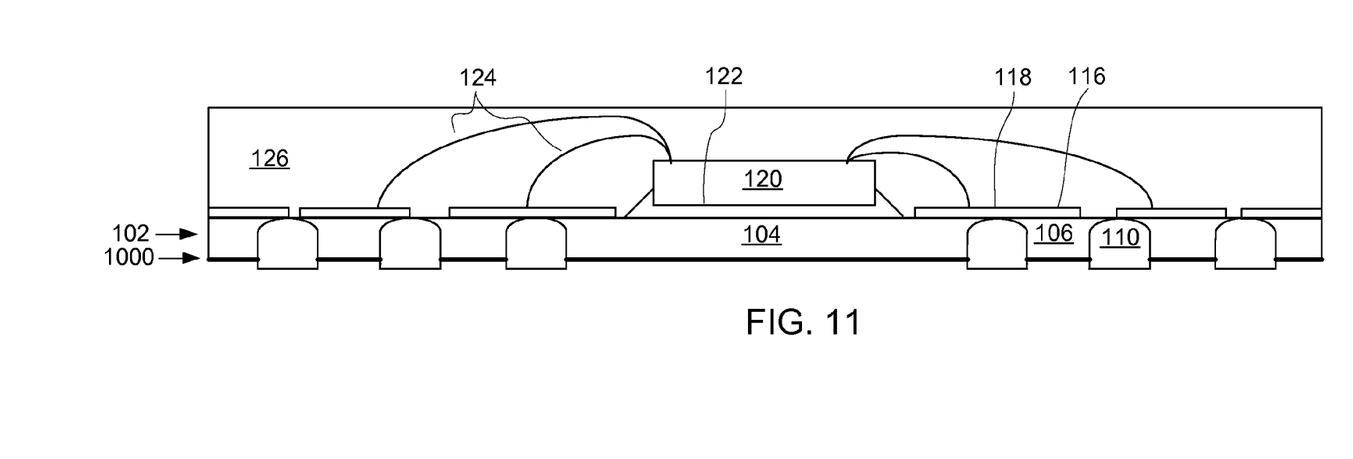
FIG. 11 is a cross-sectional view of the section of the lead frame in a screen print layer removal phase of manufacturing.

Referring now to FIG. 11, therein is shown a cross-sectional view of the section of the lead frame 102 in a screen print layer removal phase of manufacturing.

The screen layer 1002 of FIG. 10 is removed leaving the die attach paddle 104 and the electrical terminals 106 recessed in the circuitry protective material 110. This removes the need for a second surface planarization process and allows the electrical terminals 106 to be pre-plated with solder wettable material.

Figure 12:
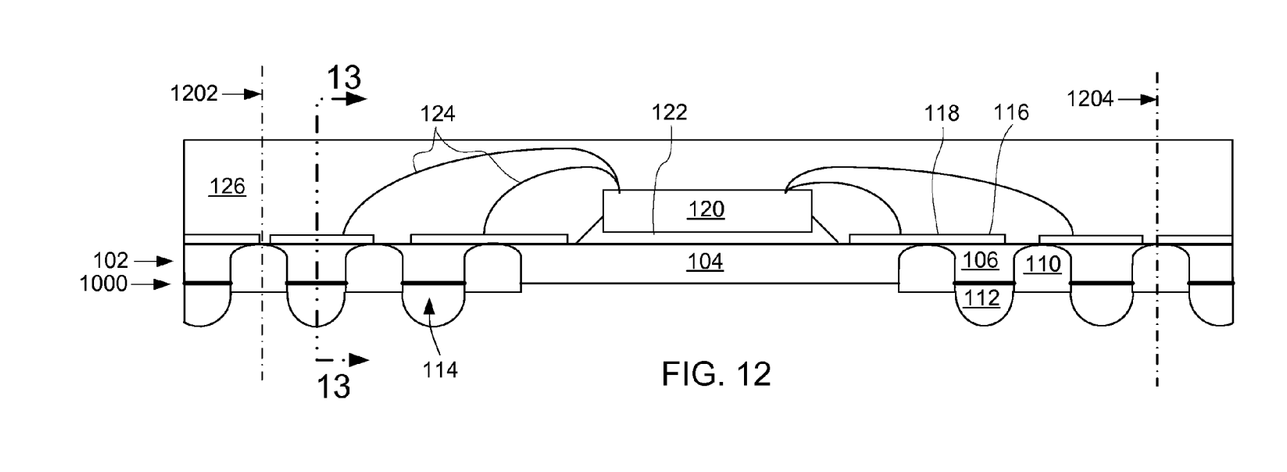
FIG. 12 is a cross-sectional view of the lead frame in a solder ball attach phase of manufacturing. The lines 13-13 indicate where the integrated circuit packaging system will be singulated or cut apart.

Referring now to FIG. 12, therein is shown a cross-sectional view of a lead frame in a solder ball attach phase of manufacturing. The lines 13-13 indicate where the integrated circuit packaging system will be singulated or cut apart. Thereafter, the lead frame 102 and the encapsulation 126 are cut or singulated along lines 1202 and 1204 into the integrated circuit packaging system 100 of FIG. 1.

The solder balls 112 extend into the circuitry protective material 110 and below the bottom of the circuitry protective material 110 with the solder balls 112 in the recessed pad volumes 114 in contact with the solder wettable material of the bottom pattern 1000.

Figure 13:
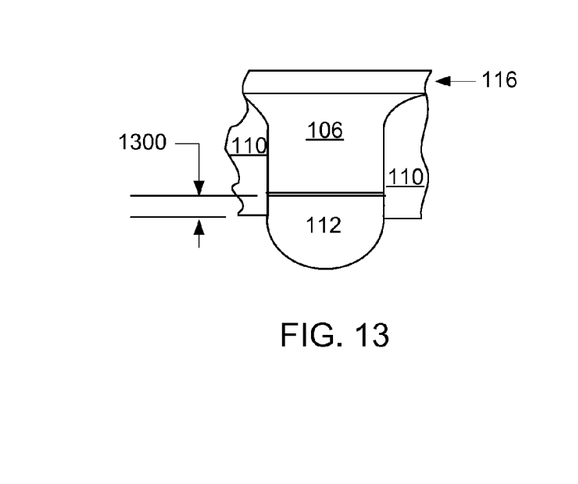
FIG. 13 is an enlarged cross-section of a terminal of FIG. 12.

Referring now to FIG. 13, therein is shown an enlarged cross-section of a terminal 106 of FIG. 12. The enlarged cross-section is taken along line 13-13 of FIG. 12. The recess distance 1300 of the solder balls 112 is controlled by the thickness of the screen layer 1002 of FIG. 10 applied and removed during processing.

Figure 14:
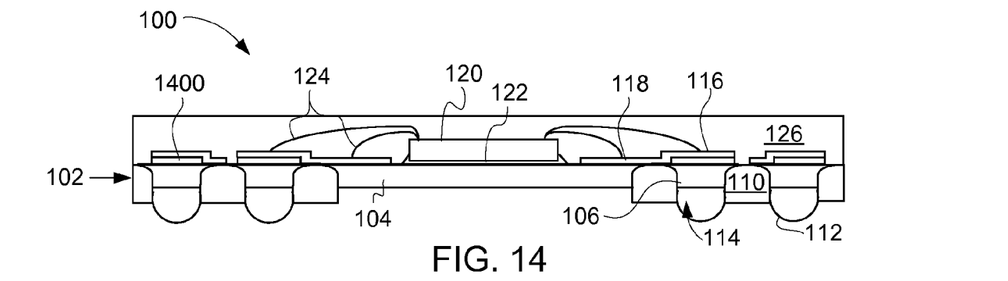
FIG. 14 is a cross-sectional view of the section of a third embodiment of the integrated circuit packaging system.

Referring now to FIG. 14, therein is shown a cross-sectional view of the section of a third embodiment of the integrated circuit packaging system. Prior to the formation of the top pads 116 and routable circuitry 118, elevated pads 1400 of a conductive material are formed on the lead frame 102 over the regions that will subsequently become the electrical terminals 106. The elevated pads 1400 allow the top surfaces of the top pads 116 and the routable circuitry 118 to have two different distances from the top surface of the circuitry protective material 110.

It has been found that the different distances can allow wire sweep control by reducing the length of the wire interconnects 124.

Figure 15:
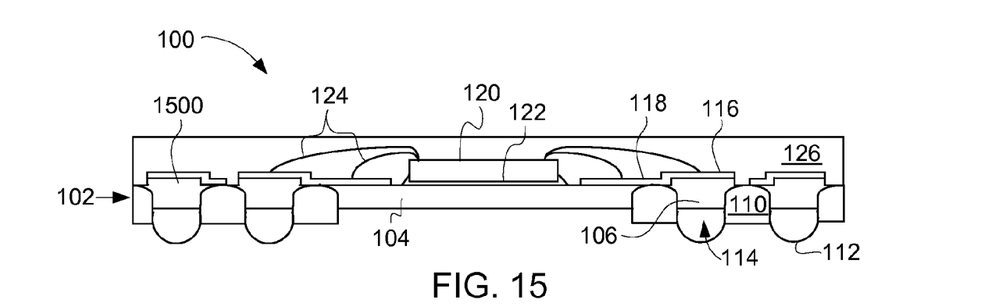
FIG. 15 is a cross-sectional view of the section of a fourth embodiment of the integrated circuit packaging system.

Referring now to FIG. 15, therein is shown a cross-sectional view of the section of a fourth embodiment of the integrated circuit packaging system. Prior to the formation of the top pads 116 and routable circuitry 118, the lead frame 102 is formed so the regions that will subsequently become the electrical terminals 106 have extensions 1500 forming elevated pads on the lead frame 102. The extensions 1500 allow the top surfaces of the top pads 116 and the routable circuitry 118 to have two different distances from the top surface of the circuitry protective material 110.

It has been found that the different distances can allow wire sweep control by reducing the length of the wire interconnects 124.

Figure 16:
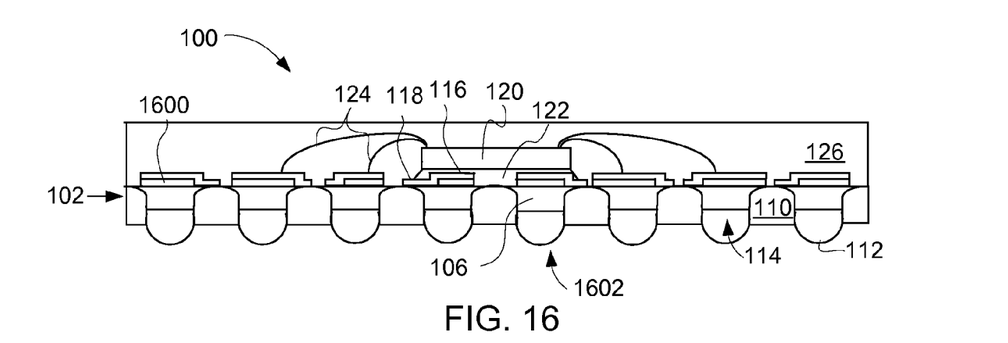
FIG. 16 is a cross-sectional view of the section of a fifth embodiment of the integrated circuit packaging system.

Referring now to FIG. 16, therein is shown a cross-sectional view of the section of a fifth embodiment of the integrated circuit packaging system. Prior to the formation of the top pads 116 and routable circuitry 118, the regions that will subsequently become the electrical terminals 106 are built up with extensions 1600 forming elevated pads on the lead frame 102. The extensions 1600 allow the top surfaces of the top pads 116 and the routable circuitry 118 to have two different distances from the top surface of the circuitry protective material 110. Further, the extensions 1600 can be formed on electrical terminals 1602, which can be formed under the die 120 and electrically connected to wire interconnects not under the die 120 by the routable circuitry 118. The die 120 is adhesively bonded by the die attach material 122 to the circuitry protective material 110.

It has been found that the different distances can allow wire sweep control by reducing the length of the wire interconnects 124 and the number of electrical terminals to be increased for the integrated circuit packaging system 100.

The electrical terminals 106 can further be under the die 120 with the routable circuitry 118 extending out from under the die 120 to connect by the wire interconnects 124 to the die 120. This permits higher ball density by using the space underneath the die 120 to hold electrical terminals 106.

Figure 17:
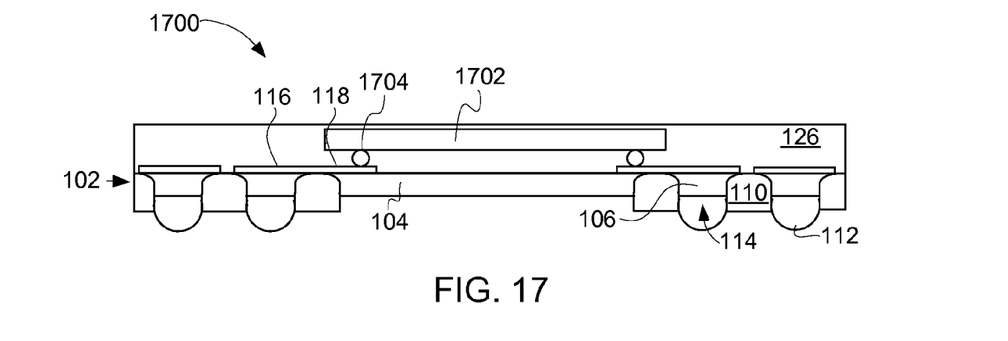
FIG. 17 is a cross-sectional view of the section of a sixth embodiment of the integrated circuit packaging system.

Referring now to FIG. 17, therein is shown a cross-sectional view of the section of a sixth embodiment of the integrated circuit packaging system. This is a flip chip integrated circuit packaging system 1700. This sixth embodiment has a similar structure to FIG. 9 but has a flip chip 1702 with fusible interconnects such as solder balls 1704 electrically connected to the routable circuitry 118. It has been found that the flip chip 1700 permits a flatter integrated circuit packaging system 1700.

Figure 18:
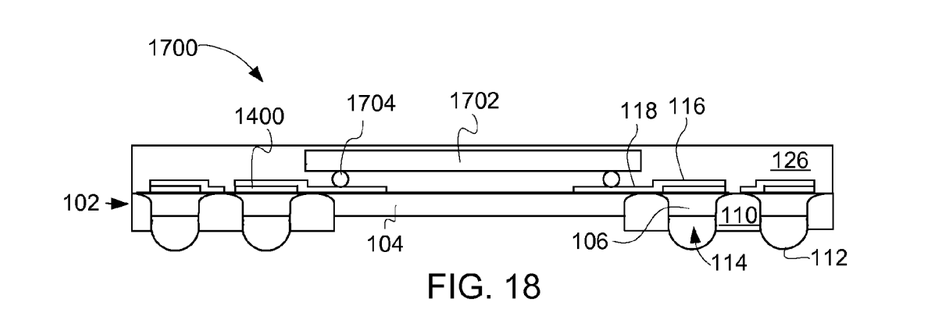
FIG. 18 is a cross-sectional view of the section of a seventh embodiment of the integrated circuit packaging system.

Referring now to FIG. 18, therein is shown a cross-sectional view of the section of a seventh embodiment of the integrated circuit packaging system 1700. This seventh embodiment has a similar structure to FIG. 14 but has a flip chip 1702 with solder balls 1704 electrically connected to the routable circuitry 118. Some of the routable circuitry 118 has top pads at both ends to make the connections to the elevated pads 116 at one end and to the solder balls 1704 at the other. The elevated pads 1400 are on top of the electrical terminals 106. It has been found that the flip chip 1702 permits a flatter integrated circuit packaging system 1700.

Figure 19:
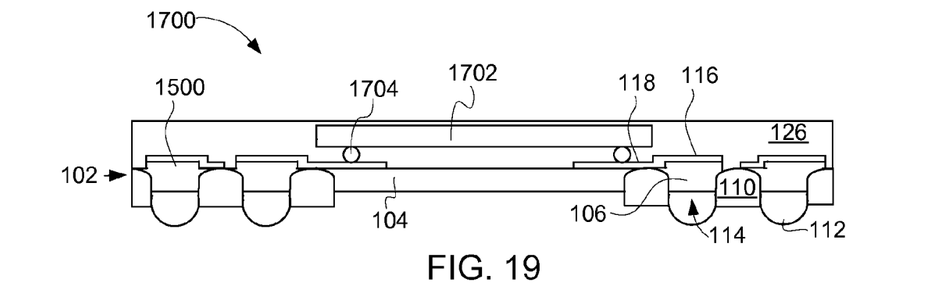
FIG. 19 is a cross-sectional view of the section of an eighth embodiment of the integrated circuit packaging system.

Referring now to FIG. 19, therein is shown a cross-sectional view of the section of an eighth embodiment of the integrated circuit packaging system. This eighth embodiment has a similar structure to FIG. 15 but has a flip chip 1700 with solder balls 1702 electrically connected to the routable circuitry 118. The electrical terminals 106 have extensions 1500 forming elevated pads. Some of the routable circuitry 118 has top pads at both ends to make the connections to the elevated pads 116 at one end and to the solder balls 1704 at the other. It has been found that the flip chip 1702 permits a flatter integrated circuit packaging system 1700.

Figure 20:
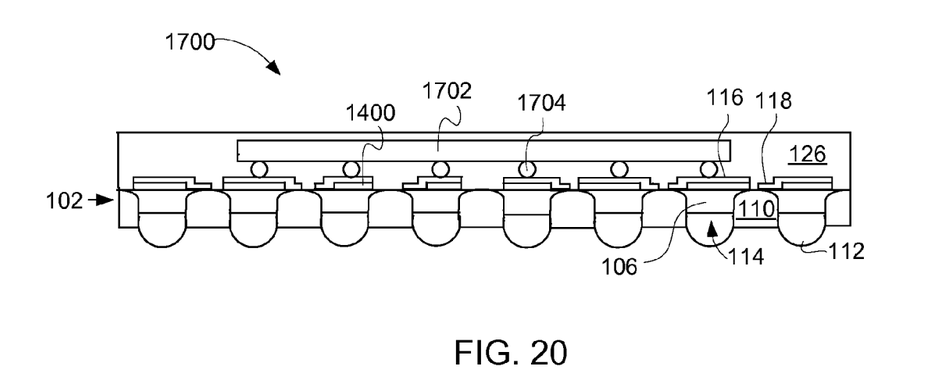
FIG. 20 is a cross-sectional view of the section of a ninth embodiment of the integrated circuit packaging system.

Referring now to FIG. 20, therein is shown a cross-sectional view of the section of a ninth embodiment of the integrated circuit packaging system. This ninth embodiment has a similar structure to FIG. 16 but has a flip chip 1700 with solder balls 1702 electrically connected to the routable circuitry 118. The electrical terminals 106 are electrically connected to elevated pads 116 electrically connected by routable circuitry 118 to top pads 116 that are electrically connected to the solder balls 1704 under the die 1702. In some cases, the top pads 116 are electrically connected directly to the solder balls 1704 or the routable circuitry 118 has top pads at both ends to make the connections to the elevated pads 116 at one end and to the solder balls 1704 at the other. It has been found that the flip chip 1700 permits the number of electrical terminals to be increased for the integrated circuit packaging system 1700.

Figure 21:
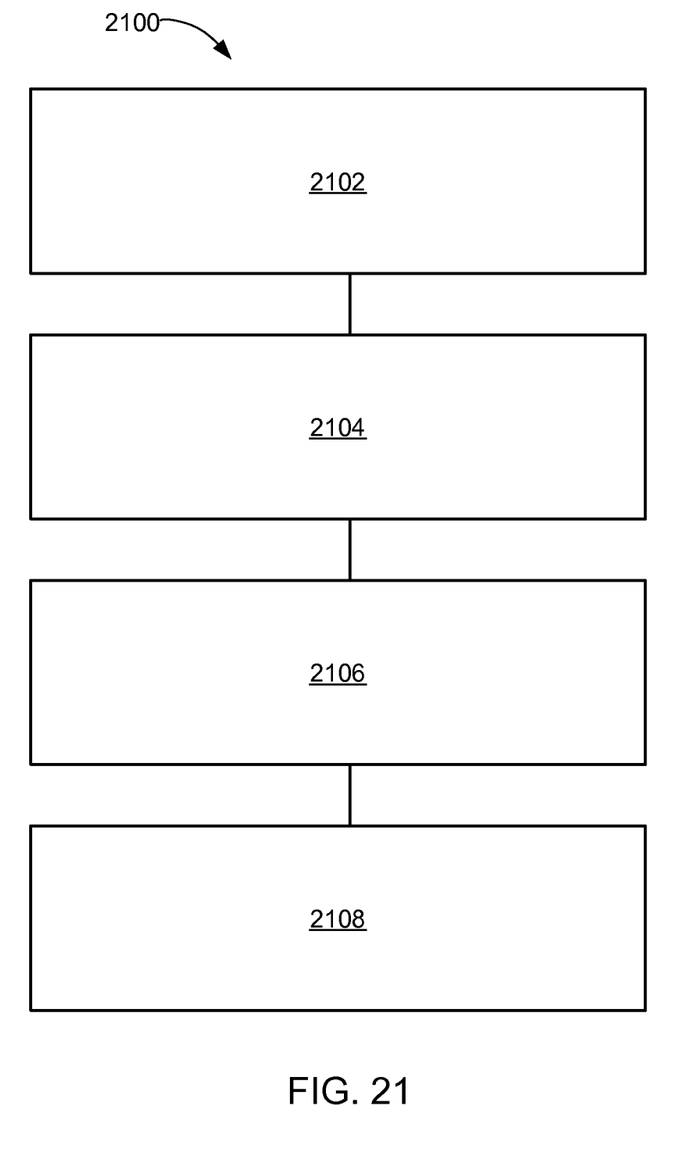
FIG. 21 is a flow chart of a method of manufacture of an integrated circuit packaging system in a further embodiment of the present invention.

Referring now to FIG. 21 therein is shown a flow chart of a method 2100 of manufacture of an integrated circuit packaging system in a further embodiment of the present invention. The method 2100 includes: providing a lead frame in a block 2102; forming routable circuitry on the top surface of the lead frame in a block 2104; attaching an integrated circuit die over the lead frame in a block 2106; and placing circuitry protective material around the electrical terminals for forming recessed pad volumes in a block 2108.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead frame;
   forming routable circuitry on the top surface of the lead frame;
   attaching an integrated circuit die over the lead frame;
   processing the bottom surface of the lead frame for forming electrical terminals including:
      providing a bottom pattern on the bottom surface of the lead frame for forming the electrical terminals,
      removing a portion of the lead frame using the bottom pattern for forming the electrical terminals, and
      removing the bottom pattern; and
   placing circuitry protective material around the electrical terminals for forming recessed pad volumes in the circuitry protective material.

2. The method as claimed in claim 1 further comprising forming fusible material in the circuitry protective material in the recessed pad volumes and extending out from the circuitry protective material.

3. The method as claimed in claim 1 further comprising forming top pads over the electrical terminals and connected to the routable circuitry.

4. The method as claimed in claim 1 further comprising wire or fusible interconnects electrically connecting the die to the electrical terminals.

5. The method as claimed in claim 1 further comprising forming solder wettable material on the bottom surfaces of the electrical terminals.

6. The method as claimed in claim 1 further comprising forming electrical terminals under the die.

7. The method as claimed in claim 1 wherein processing the bottom surface of the lead frame includes processing for forming a die attach paddle.

8. The method as claimed in claim 1 further comprising forming extensions of the electrical terminals above the top surface of the circuitry protective material.

9. The method as claimed in claim 1 further comprising forming elevated pads on the top surfaces of the electrical terminals.

10. An integrated circuit packaging system comprising:
    electrical terminals;
    circuitry protective material around the electrical terminals and formed to have recessed pad volumes, the electrical terminals having extensions of the electrical terminals above a top surface of the circuitry protective material;
    routable circuitry on the top surface of the circuitry protective material; and
    an integrated circuit die electrically connected to the electrical terminals.

11. The system as claimed in claim 10 further comprising an encapsulation on the circuitry protective material.

12. The system as claimed in claim 10 further comprising fusible material in the circuitry protective material in the recessed pad volumes and extending out from the circuitry protective material.

13. The system as claimed in claim 10 further comprising top pads over the electrical terminals and connected to the routable circuitry.

14. The system as claimed in claim 10 further comprising wire or fusible interconnects electrically connecting the die to the electrical terminals.

15. The system as claimed in claim 10 further comprising solder wettable material on the bottom surfaces of the electrical terminals.

16. The system as claimed in claim 10 further comprising electrical terminals under the die.

17. The system as claimed in claim 10 further comprising a die attach paddle in the circuitry protective material.

18. The system as claimed in claim 10 further comprising elevated pads on the top surfaces of the electrical terminals.

* * * * *